(12) United States Patent
Blondin et al.

(10) Patent No.: US 9,801,279 B1
(45) Date of Patent: Oct. 24, 2017

(54) CONFIGURABLE SYSTEM BOARD

(71) Applicant: EMC Corporation, Hopkinton, MA (US)

(72) Inventors: John Blondin, Hopkinton, MA (US); Ralph C. Frangioso, Franklin, MA (US); Joseph P. King, Jr., Sterling, MA (US); Stephen E. Strickland, Foxborough, MA (US); David C. Bisbee, Princeton, MA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 33 days.

(21) Appl. No.: 14/042,488

(22) Filed: Sep. 30, 2013

(51) Int. Cl.
*H05K 5/00* (2006.01)
*H05K 1/18* (2006.01)

(52) U.S. Cl.
CPC ..................... *H05K 1/18* (2013.01)

(58) Field of Classification Search
CPC ....... H05K 5/0026–5/0082; G05F 1/10; G06F 11/3058; G06F 1/26; H02M 2001/0003; H02M 3/156; G03G 15/09; G03G 15/1685
USPC ........ 361/735–738, 752, 784–785, 788–791; 713/300
See application file for complete search history.

(56) References Cited

U.S. PATENT DOCUMENTS

| | | | |
|---|---|---|---|
| 5,787,014 A | 7/1998 | Hall et al. | |
| 8,292,647 B1* | 10/2012 | McGrath | H01R 12/7005 439/327 |
| 8,892,911 B2* | 11/2014 | Makley | G06F 1/26 713/300 |
| 2007/0090517 A1 | 4/2007 | Moon et al. | |
| 2008/0162963 A1 | 7/2008 | Kung et al. | |
| 2008/0169797 A1 | 7/2008 | Zambetti et al. | |
| 2009/0257578 A1 | 10/2009 | Shih et al. | |
| 2009/0296360 A1 | 12/2009 | Doblar et al. | |
| 2009/0313485 A1* | 12/2009 | Huang | G06F 1/26 713/300 |
| 2013/0082764 A1 | 4/2013 | Kothari et al. | |
| 2013/0249394 A1 | 9/2013 | Fay | |
| 2014/0082381 A1* | 3/2014 | Dinh | G06F 1/26 713/300 |

OTHER PUBLICATIONS

Non-Final Office Action dated Sep. 29, 2015 in related U.S. Appl. No. 14/042,470.
Final Office Action dated May 13, 2016 in counterpart U.S. Appl. No. 14/042,470.

* cited by examiner

*Primary Examiner* — Yuriy Semenenko
(74) *Attorney, Agent, or Firm* — Brian J. Colandreo; Mark H. Whittenberger; Holland & Knight LLP

(57) ABSTRACT

A system board includes at least one microprocessor coupled to the system board. A VR module card includes a voltage regulator circuit, wherein the voltage regulator circuit is configured to provide electrical power to the at least one microprocessor. A circuit board region is configured to receive the VR module card.

17 Claims, 3 Drawing Sheets

CONFIGURABLE SYSTEM BOARD

TECHNICAL FIELD

This disclosure relates to system boards and, more particularly, to configurable system boards.

BACKGROUND

In today's IT infrastructure, high availability is of paramount importance. Specifically, critical (and sometimes non-critical) components within an IT infrastructure are often layered in redundancy. For example, primary servers may be supported by backup servers; primary switches may be supported by backup switches; primary power supplies may be supported by backup power supplies; and primary storage systems may be supported by backup storage systems.

When designing such high availability devices, extensive testing may be performed to ensure their functionality and reliability. Accordingly, in the event that a specific component in one of these high availability devices (such as a processor or a voltage regulator circuit) becomes unavailable, the high availability device will need to be redesigned. For example, if a specific circuit on a system board is no longer available and needs to be replaced with a suitable substitute, to accommodate such a change, the system board may need to be rerouted and the completed system may need to be extensively tested to ensure its functionality and reliability.

SUMMARY OF DISCLOSURE

In one implementation, a system board includes at least one microprocessor coupled to the system board. A VR module card includes a voltage regulator circuit, wherein the voltage regulator circuit is configured to provide electrical power to the at least one microprocessor. A circuit board region is configured to receive the VR module card.

One or more of the following features may be included. The voltage regulator circuit may be a multi-phase voltage regulator circuit. The multi-phase voltage regulator circuit may include a plurality of transistors and a plurality of capacitors. The circuit board region and the VR module card may be electrically coupled via a multi-piece electrical socket. The circuit board region may include a first portion of the multi-piece electrical socket. The VR module card may include a second portion of the multi-piece electrical socket. The second portion of the multi-piece electrical socket may be configured to releasably engage the first portion of the multi-piece electrical socket. The circuit board region and the VR module card may be electrically coupled via one or more solder connections. The circuit board region may include a solder pad array configured to electrically couple the VR module card to the system board. The system board may be configured for use in a high availability storage system.

In another implementation, a system board includes at least one microprocessor coupled to the system board. A VR module card includes a multi-phase voltage regulator circuit, wherein the multi-phase voltage regulator circuit is configured to provide electrical power to the at least one microprocessor. A circuit board region is configured to receive the VR module card.

One or more of the following features may be included. The multi-phase voltage regulator circuit may include a plurality of transistors and a plurality of capacitors. The circuit board region and the VR module card may be electrically coupled via a multi-piece electrical socket. The circuit board region may include a first portion of the multi-piece electrical socket. The VR module card may include a second portion of the multi-piece electrical socket, wherein the second portion of the multi-piece electrical socket may be configured to releasably engage the first portion of the multi-piece electrical socket. The circuit board region and the VR module card may be electrically coupled via one or more solder connections. The circuit board region may include a solder pad array configured to electrically couple the VR module card to the system board. The system board may be configured for use in a high availability storage system.

In another implementation, a high availability storage system includes a system board. The system board includes at least one microprocessor coupled to the system board and a VR module card including a multi-phase voltage regulator circuit. The multi-phase voltage regulator circuit is configured to provide electrical power to the at least one microprocessor. A circuit board region is configured to receive the VR module card. An enclosure is configured to house the system board.

One or more of the following features may be included. The circuit board region and the VR module card may be electrically coupled via a multi-piece electrical socket. The circuit board region may include a first portion of the multi-piece electrical socket. The VR module card may include a second portion of the multi-piece electrical socket. The second portion of the multi-piece electrical socket may be configured to releasably engage the first portion of the multi-piece electrical socket. The circuit board region and the VR module card may be electrically coupled via one or more solder connections.

The details of one or more implementations are set forth in the accompanying drawings and the description below. Other features and advantages will become apparent from the description, the drawings, and the claims.

BRIEF DESCRIPTION OF THE DRAWINGS

FIG. 2A is a diagrammatic view of one implementation of a voltage regulator circuit included within system board of FIG. 2;

FIG. 2B is a cross-sectional view of one implementation of the system board of FIG. 2.

Like reference symbols in the various drawings indicate like elements.

DETAILED DESCRIPTION OF THE PREFERRED EMBODIMENTS

Figure 1:
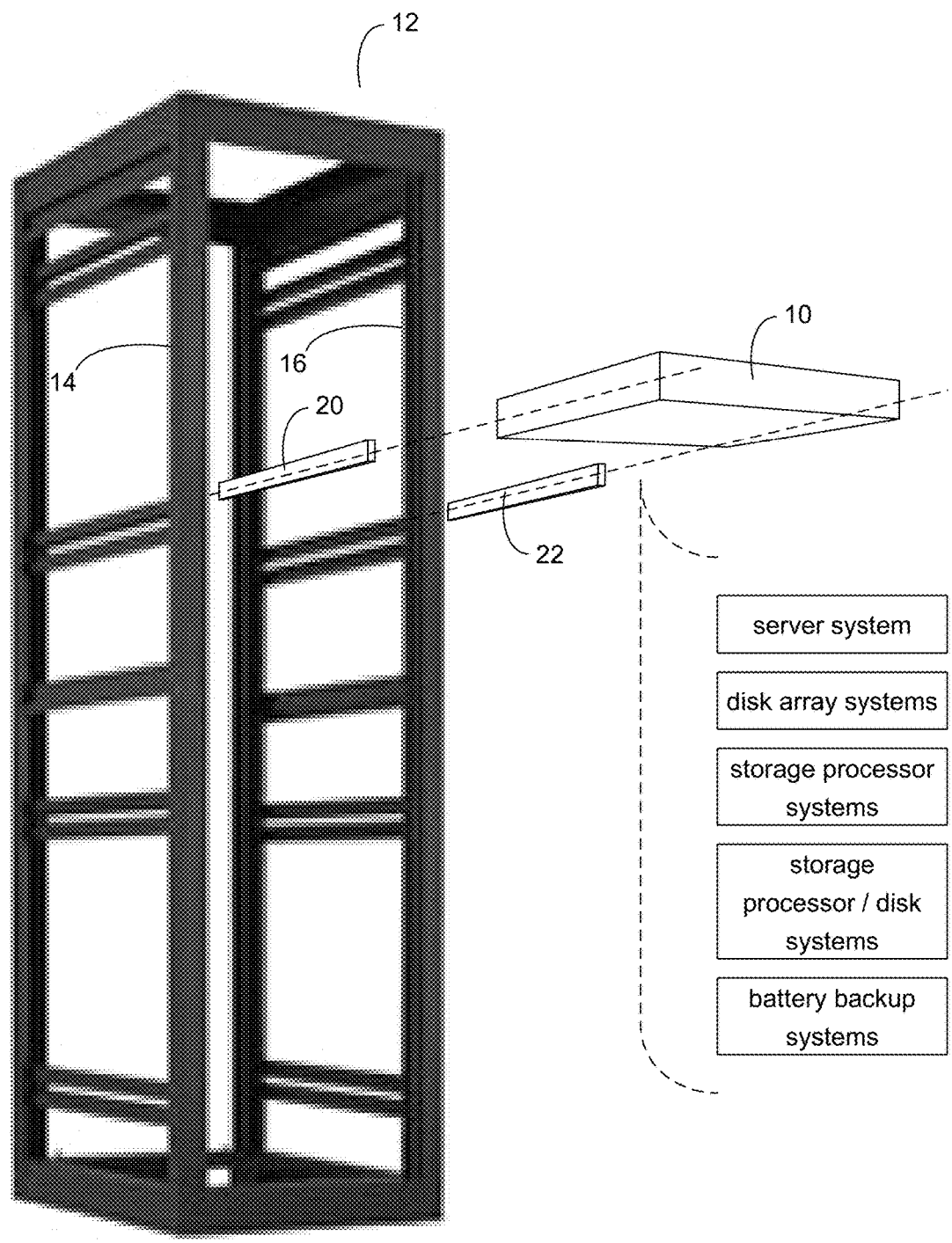
FIG. 1 is a perspective view of an IT rack and an IT device.

Referring to FIG. 1, IT devices (e.g., IT device 10) may be utilized by organizations to process and store data. Examples of IT device 10 may include but are not limited to the various components of high-availability storage systems, such as: server systems, disk array systems, storage processor systems, storage processor/disk systems, and battery backup systems.

IT racks (e.g., IT rack 12) may be utilized to store and organize these IT devices (e.g., IT device 10). For example, IT rack 12 may be placed within a computer room and various IT devices may be attached to rails (e.g., NEMA rails 14, 16) included within IT rack 12, wherein these rails (e.g., NEMA rails 14, 16) may have a standard and defined spacing between them (e.g., 19"). Typically, IT devices that are configured to fit within IT rack 12 may be described as rack-mountable IT devices. Alternatively. IT device 10 may be a free-standing device that does not require an IT rack for mounting.

Figure 2:
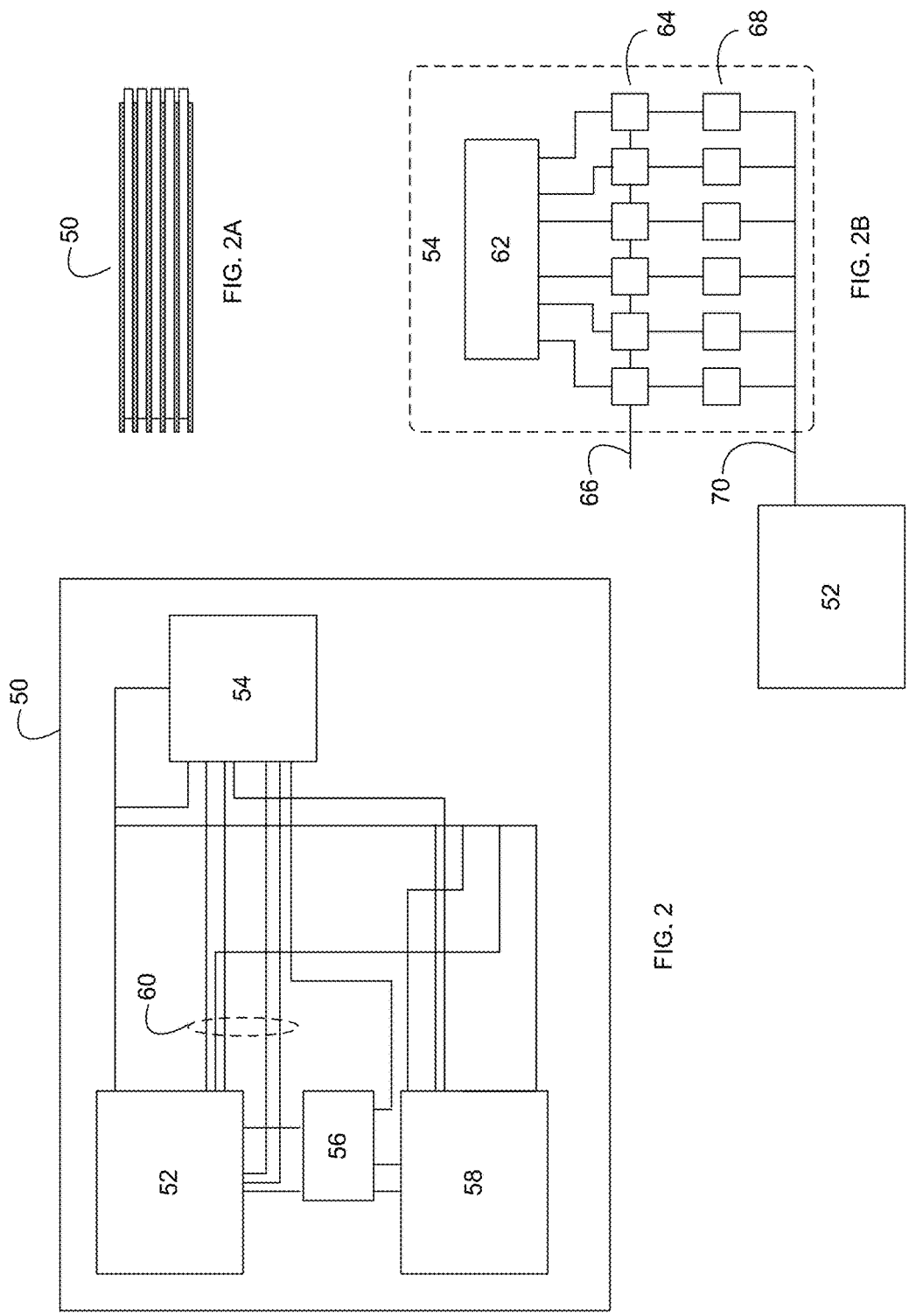
FIG. 2 is a diagrammatic view of a system board included within the IT device of FIG. 1.

Referring also to FIG. 2, positioned within IT device 10 may be one or more system boards (e.g., system board 50) that may include a plurality of circuits 52, 54, 56, 58, examples of which may include but are not limited to microprocessors, memory circuits, voltage regulator circuits, and controller circuits. As is known in the art, such circuits may be electrically coupled together via conductive traces 60 included within/etched upon system board 50. Further and as is known in the art, such system boards may be multi-layer system boards (as shown in FIG. 2A), wherein (in this example) system board 50 is shown to include six layers of conductive traces separated by five layers of non-conductive material (e.g., glass-reinforced epoxy laminate).

Assume for illustrative purposes that circuit 52 is a microprocessor and circuit 54 is a voltage regulator circuit that is configured to provide power to (among other things) microprocessor 52. An example of voltage regulator circuit 54 may include a multi-phase voltage regulator circuit. Referring also to FIG. 2B, when configured in a multi-phase fashion, voltage regulator circuit 54 may include controller 62, a plurality of switches (e.g., field effect transistors) 64 that may be used to selectively charge (via voltage source 66) and discharge a plurality of energy storage devices (e.g., capacitors) 68, wherein the output of these capacitors may be tied together to generate voltage source 70 that may power e.g., microprocessor 52. Accordingly, by varying the energizing signals (e.g., pulse-width-modulated signals) that are applied by controller 62 to switches 64, the amplitude of voltage source 70 may be varied in accordance with the needs of microprocessor 52.

Unfortunately, sometimes during the lifespan of a product, one or more of the plurality of circuits 52, 54, 56, 58 included within system board 50 may become unavailable (e.g., due to product cancellation/evolution, natural disasters, or corporate bankruptcies/mergers). As system board 50 (and the conductive traces thereon) are designed to accommodate a particular circuit, the unavailability of such a circuit may be problematic for the manufactures of system board 50, as system board 50 will need to be redesigned to accommodate a substitute circuit and then the redesigned system board will need to be subjected to the above-described testing procedures.

Figure 3:
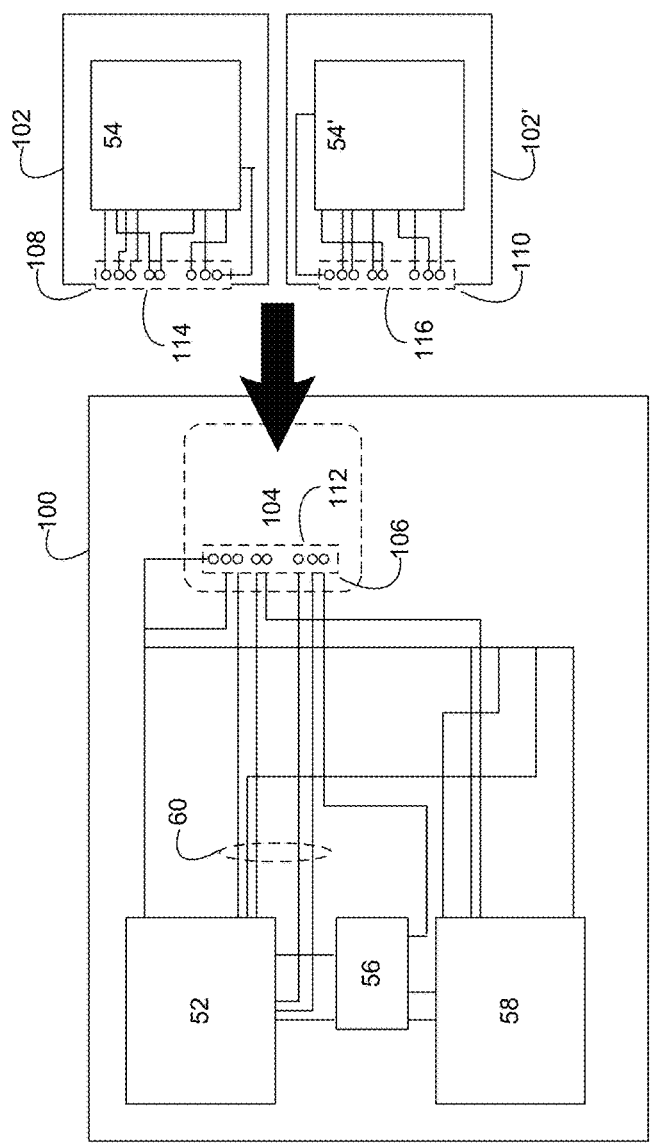
FIG. 3 is a diagrammatic view of an alternative embodiment of the system board included within the IT device of FIG. 1.

Referring also to FIG. 3, there is shown system board 100 that may be configured to accommodate a plurality of different circuits (to allow for easy circuit substitution in the event that a specific circuit becomes unavailable). System board 100 may include at least one microprocessor (e.g., microprocessor 52) coupled to system board 100 and a VR (i.e., voltage regulator) module card (e.g., VR module card 102) including a voltage regulator circuit (e.g., voltage regulator circuit 54). The voltage regulator circuit (e.g., voltage regulator circuit 54) may be configured to provide electrical power to the at least one microprocessor (e.g., microprocessor 52). System board 100 may also include a circuit board region (e.g., circuit board region 104) that may be configured to receive the VR module card (e.g., VR module card 102).

Accordingly, by placing the voltage regulator circuit (e.g., voltage regulator circuit 54) on a VR module card (e.g., VR module card 102) that is electrically coupled to system board 100 (as opposed to including the voltage regulator circuit (e.g., voltage regulator circuit 54) on system board 100), system board 100 may be more-easily redesigned/reconfigured to utilize an alternative voltage regulator circuit (e.g., voltage regulator circuit 54') in the event that the original voltage regulator circuit (e.g., voltage regulator circuit 54) becomes unavailable.

For example, in the event that the original voltage regulator circuit (e.g., voltage regulator circuit 54) becomes unavailable (e.g., due to a tsunami destroying the factory that manufactures voltage regulator circuit 54), subsequently-manufactured versions of system board 100 may utilize the alternative voltage regulator circuit (e.g., voltage regulator circuit 54') coupled to system board 100 via an alternative VR module card (e.g., VR module card 102'). Accordingly, instead of needing to redesign system board 100 to include the alternative voltage regulator circuit (e.g., voltage regulator circuit 54'), only the alternative VR module card (e.g., VR module card 102') may need to be designed (or original VR module card 102 may be modified) to accept the alternative voltage regulator circuit (e.g., voltage regulator circuit 54'). Further, in the event that the alternative VR module card (e.g., VR module card 102') is designed/tested to ensure compatibility with system board 100 at the same time that system board 100 is designed/tested, retrofitting system board 100 to utilize the alternative voltage regulator circuit (e.g., voltage regulator circuit 54') may be as simple as electrically coupling the alternative VR module card (e.g., VR module card 102') to system board 100 (instead of the original VR module card (e.g., VR module card 102)).

As discussed above, the voltage regulator circuit (e.g., voltage regulator circuit 54) may be a multi-phase voltage regulator circuit. And if the voltage regulator circuit (e.g., voltage regulator circuit 54) is a multi-phase voltage regulator circuit, the voltage regulator circuit (e.g., voltage regulator circuit 54) may include a plurality of transistors (e.g., switches 58; FIG. 2B) and a plurality of capacitors (e.g., energy storage devices 62, FIG. 2B) for powering microprocessor 52.

The VR module cards (e.g., VR module card 102 and/or VR module card 102') may be electrically coupled to system board 100 using various methodologies.

For example, circuit board region 104 of system board 100 may be electrically coupled to the VR module card (e.g., VR module card 102 and/or VR module card 102') via one or more solder connections. Specifically, circuit board region 104 of system board 100 may include a solder pad array (e.g., solder pad array 106) configured to electrically couple the VR module card (e.g., VR module card 102 and/or VR module card 102') to system board 100. For example, the VR module card (e.g., VR module card 102 and/or VR module card 102') may include a corresponding solder pad array (e.g., solder pad array 108, 110 respectively) that may be configured to mate with and/or engage the solder pad array (e.g., solder pad array 106) included within circuit board region 104 of system board 100, thus establishing an electrical coupling between the VR module card (e.g., VR module card 102 and/or VR module card 102') and system board 100.

Alternatively, circuit board region 104 and the VR module card (e.g., VR module card 102 and/or VR module card 102') may be electrically coupled via a multi-piece electrical socket. When utilizing such a multi-piece electrical socket, circuit board region 104 may include a first portion (e.g., first socket portion 112; shown in phantom) of the multi-piece electrical socket and the VR module card (e.g., VR module card 102 and/or VR module card 102') may include a second portion (e.g., second socket portion 114, 116 respectively; shown in phantom) of the multi-piece electrical socket, wherein the second portion (e.g., second socket portion 114, 116) of the multi-piece electrical socket is configured to releasably engage the first portion (e.g., first socket portion 112) of the multi-piece electrical socket.

When circuit board region 104 and the VR module card (e.g., VR module card 102 and/or VR module card 102') are designed to be electrically coupled via such a multi-piece electrical socket, the redesign of system board 100 to utilize an alternative voltage regulator circuit (e.g., voltage regulator circuit 54') instead of the original voltage regulator circuit (e.g., voltage regulator circuit 54) may be as simple as plugging VR module card 102' (as opposed to VR module card 102) into first socket portion 112 of the multi-piece electrical socket.

Accordingly, through the use of a VR module card (e.g., VR module card 102 and/or VR module card 102'), the VR module card may be changed from e.g., a first source to a second source without requiring advanced notice or a substantial redesign of system board 100 (and the cost and delay associated with the same). Additionally, due to the enhanced density associated with modern system boards (e.g., system board 100), the use of a VR module card (e.g., VR module card 102 and/or VR module card 102') may allow two design solutions to fit within the same space on system board 100.

Having thus described the disclosure of the present application in detail and by reference to embodiments thereof, it will be apparent that modifications and variations are possible without departing from the scope of the disclosure defined in the appended claims.

What is claimed is:

1. A server system board comprising:
    at least one microprocessor coupled to the server system board;
    a Voltage Regulator (VR) module card including a multi-phase voltage regulator circuit, wherein the multi-phase voltage regulator circuit is configured to provide primary electrical power to the at least one microprocessor using one or more conductive traces of a circuit board region of the server system board;
    the circuit board region configured to receive the multi-phase voltage regulator circuit via the VR module card using the one or more conductive traces of the circuit board region; and
    the circuit board region further configured to receive an alternative multi-phase voltage regulator circuit via an alternative VR module card using the one or more conductive traces of the circuit board region, wherein the alternative multi-phase voltage regulator circuit is configured to provide the primary electrical power to the at least one microprocessor.

2. The server system board of claim 1 wherein the multi-phase voltage regulator circuit includes a plurality of transistors and a plurality of capacitors.

3. The server system board of claim 1 wherein the circuit board region and the VR module card are electrically coupled via a multi-piece electrical socket.

4. The server system board of claim 3 wherein the circuit board region includes a first portion of the multi-piece electrical socket.

5. The server system board of claim 4 wherein the VR module card includes a second portion of the multi-piece electrical socket, wherein the second portion of the multi-piece electrical socket is configured to releasably engage the first portion of the multi-piece electrical socket.

6. The server system board of claim 1 wherein the server system board is configured for use in a high availability storage system.

7. A server system board comprising:
    at least one microprocessor coupled to the server system board;
    a Voltage Regulator (VR) module card including a multi-phase voltage regulator circuit, wherein the multi-phase voltage regulator circuit is configured to provide primary electrical power to the at least one microprocessor using one or more conductive traces of a circuit board region of the server system board;
    the circuit board region configured to receive the multi-phase voltage regulator circuit via the VR module card using the one or more conductive traces of the circuit board region; and
    the circuit board region further configured to receive an alternative multi-phase voltage regulator circuit via an alternative VR module card using the one or more conductive traces of the circuit board region, wherein the alternative multi-phase voltage regulator circuit is configured to provide the primary electrical power to the at least one microprocessor.

8. The server system board of claim 7 wherein the multi-phase voltage regulator circuit includes a plurality of transistors and a plurality of capacitors.

9. The server system board of claim 7 wherein the circuit board region and the VR module card are electrically coupled via a multi-piece electrical socket.

10. The server system board of claim 9 wherein the circuit board region includes a first portion of the multi-piece electrical socket.

11. The server system board of claim 10 wherein the VR module card includes a second portion of the multi-piece electrical socket, wherein the second portion of the multi-piece electrical socket is configured to releasably engage the first portion of the multi-piece electrical socket.

12. The server system board of claim 7 wherein the server system board is configured for use in a high availability storage system.

13. A high availability storage system comprising:
    a server system board including:
    at least one microprocessor coupled to the sever system board,
    a Voltage Regulator (VR) module card including a multi-phase voltage regulator circuit, wherein the multi-phase voltage regulator circuit is configured to provide primary electrical power to the at least one microprocessor using one or more conductive traces of a circuit board region of the server system board, and
    the circuit board region configured to receive the multi-phase voltage regulator circuit via the VR module card using the one or more conductive traces of the circuit board region,
    the circuit board region further configured to receive an alternative multi-phase voltage regulator circuit via an alternative VR module card using the one or more conductive traces of the circuit board region, wherein the alternative multi-phase voltage regulator circuit is configured to provide the primary electrical power to the at least one microprocessor; and an enclosure configured to house the server system board.

14. The high availability storage system of claim 13 wherein the circuit board region and the VR module card are electrically coupled via a multi-piece electrical socket.

15. The high availability storage system of claim 14 wherein the circuit board region includes a first portion of the multi-piece electrical socket.

16. The high availability storage system of claim 15 wherein the VR module card includes a second portion of the multi-piece electrical socket, wherein the second portion of the multi-piece electrical socket is configured to releasably engage the first portion of the multi-piece electrical socket.

17. The high availability storage system of claim 13 wherein the circuit board region and the VR module card are electrically coupled via one or more solder connections.

* * * * *